United States Patent [19]

Schreckeneder

[11] 3,842,478

[45] Oct. 22, 1974

[54] DEVICE FOR REMOVING COMPONENTS CONNECTED TO A CIRCUIT BOARD

[75] Inventor: Karl Schreckeneder, Muenchen, Germany

[73] Assignee: Siemens Akteingesellschaft, Berlin, Munich, Germany

[22] Filed: Sept. 17, 1973

[21] Appl. No.: 397,885

[30] Foreign Application Priority Data

Sept. 22, 1972 Germany............................ 2246732

[52] U.S. Cl............................................... 29/203 B
[51] Int. Cl. . H05k 13/04, B23p 19/04, B25b 27/02
[58] Field of Search............... 29/203 B, 203 H, 206

[56] References Cited

UNITED STATES PATENTS

| | | | |
|---|---|---|---|
| 3,045,336 | 7/1962 | Northrop et al. | 29/203 H |
| 3,377,689 | 4/1968 | Kimmett | 29/206 X |
| 3,557,430 | 1/1971 | Jones | 29/203 B |

*Primary Examiner*—Thomas H. Eager
*Attorney, Agent, or Firm*—Hill, Gross, Simpson, Van Santen, Steadman, Chiara & Simpson

[57] ABSTRACT

A device or tool for removing a component of small dimensions from a carrier plate or circuit board which component is connected to the carrier plate by connecting elements which project through openings in the carrier plate and are attached to conductors thereon by solder joints characterized by a tong-like tool having a heating head mounted on one leg of the tool and a gripping head, which has spaced pairs of gripping elements being rotatably mounted on the other leg to present a selected pair of gripping elements in an operable arrangement with the heating head. A spring biased member is associated with each pair of gripping elements. The spring biased member engages the carrier plate and urges the housing and component engaged by the gripping elements away from the carrier plate to withdraw the connecting elements from the opening as the solder joints are melted or liquefied by the heating head. Preferably, the spring biased members of each of the separate pairs of gripping elements are aligned so that a single compression spring urges both of the members to the outermost position. The housing is also preferably provided with a detent to hold the housing in selected operable positions on its rotatable mounting.

10 Claims, 3 Drawing Figures

PATENTED OCT 22 1974 | 3,842,478

DEVICE FOR REMOVING COMPONENTS CONNECTED TO A CIRCUIT BOARD

BACKGROUND OF THE INVENTION

1. Field of the Invention

The present invention relates to a tool or device for removing a component from a carrier plate or circuit board by melting the solder connection and withdrawing the component.

2. Prior Art

An electrical component which is mounted on a carrier plate such as a circuit board is often mounted by connecting elements of the component extending through openings provided in the plate which elements are soldered to conductive strips on the surface opposite to the surface on which the componnet is mounted. To remove such a component, tong-like tools have been suggested which are provided on one leg of the tool with a gripping clamp for the component to be removed and a heating head affixed on the other leg for applying heat to the solder joints to cause melting or liquefication thereof. In these tools, a spring is provided to bias the legs apart so that as the solder joint is heated to a temperature to cause melting, the spring urges the legs apart to withdraw the component and its connecting elements from the openings in the board or plate. Oftentimes, the heating head is provided with a device to apply a suction adjacent to the heating head to remove the molten solder as it is formed. One disadvantage of this type of tool is that the sizes or dimensions of verious components are different and that the spring force required to withdraw the components which may be connected by different number of connecting elements is different

SUMMARY OF THE INVENTION

The present invention is directed to an improved tool or device of the tong-type for removing components from a carrier plate or circuit board. The device comprises tong-liketool having pair of legs interconnected at a pivot point, meansfor gripping the component is disposed on a end of one of thepair of legs and a heating head having bores in a face for receivingthe solder joints applying heat to the solder joints of the compo-nentsis disposed on an end of the other of the pair of legs withthe improvement comprising the means for gripping including ahousing, at least one pair of gripping elements mounted on oppositesurfaces of the housing adjacent one end surface thereof with afree end of each element extending passed the end surface forengaging the component to be removed from the carrier plate,at least one member mounted on said housing with the end of eachmember being movable between a first position extneding passedthe free ends of the gripping elements to a second position adja-centthe free ends, and means biasing said member to said first position so that when the pair of gripping elements engages a component and the solder joints connecting the connecting elements of thecomponent to the carrier are liquefied by the heating head and that member engages the surface of the carrier plate, the biasing means acting on the member urges the housing away from the carrier plate to withdraw the connecting elements of the component from the openings in the carrier plate. Preferably, the housing is provided with more than one pair of connecting elements with at least one spring biased member associated with each pair with the different pairs having different dimensions for engaging components of different sizes. The housing is preferably mounted for rotation to position various pairs of the gripping elements in a working engagement and is provided with means such as a detent for holding the housing in the desired working positions. Preferably, the spring biased members which are associated with opposite pairs of engaging elements are positioned in alignment so that a single compression spring acts to bias both members to the first position. In one embodiment, the movement of the member to the first position triggers or actuates a suction device or means provided on the heating head.

DESCRIPTION OF THE PREFERRED EMBODIMENTS

Figure 1:
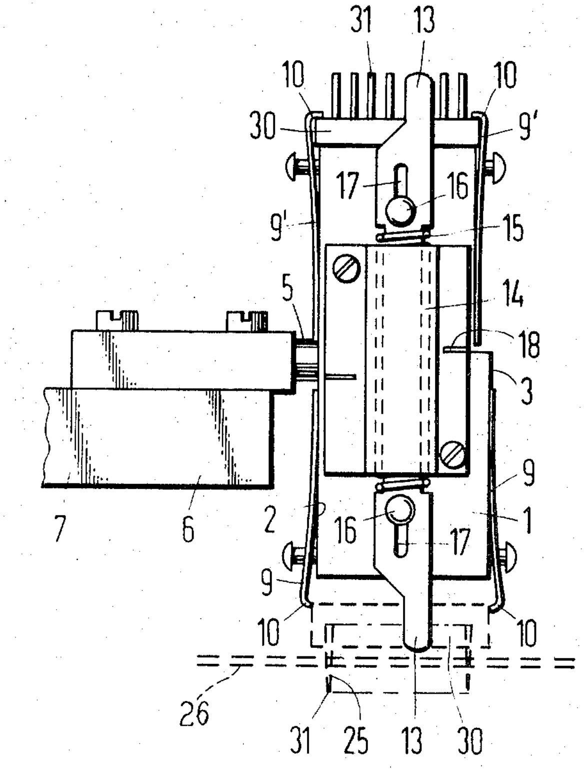
FIG. 1 is a side view of a gripping head of the present invention positioned on one end of the device.
Figure 3:
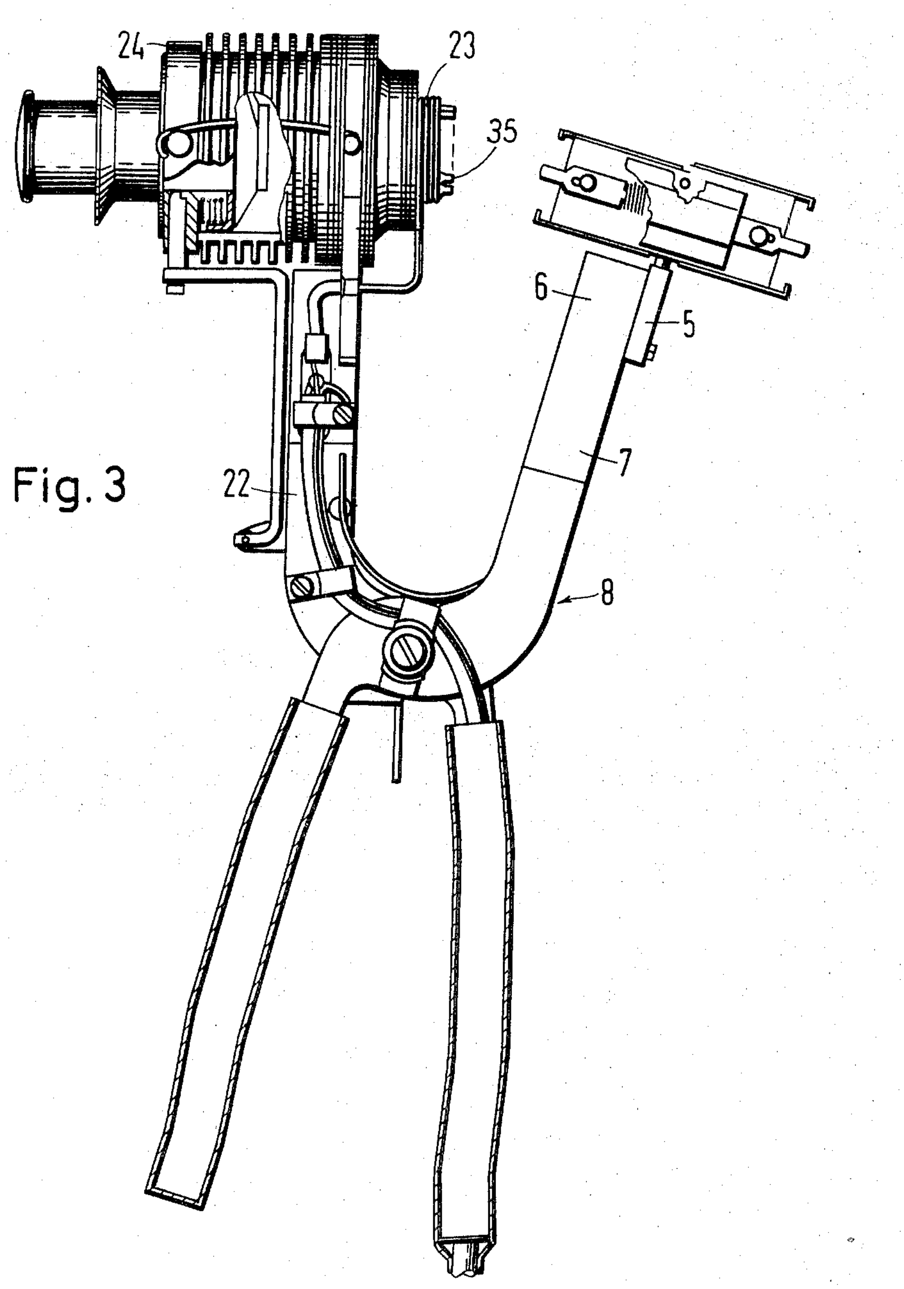
FIG. 3 is a plan view of a tong-like tool for removing components from a circuit board carrying the gripping head with portions broken away of the device of the present invention. Present invention.

The principles of the present invention are particularly useful when incorporated in a tong-like tool generally indicated at 8 in FIG. 3. The tong-like tool has a pair of legs 7 and 22 which are pivotably interconnected. Disposed on the end 6 of the leg 7 is a shaft or bolt 5 which rotatably supports a means for gripping a component such as 30 (FIG. 1). On the other leg 22 of the pair of legs is a heating head 23 and a suction device 24. The heating head 23 is provided with a face, the face or surface of the heating head 23 is provided with a heating element which is connected via an electrical cable extending along the leg 22 to an appropriate power source. An example of the suction means 24 can be a piston disposed in a cylinder and urged in one direction by a spring. The piston may be manually cocked to a spring loaded position and is held in this position by a trigger or pawl. When the trigger or pawl is withdrawn, the spring shifts the piston in the cylinder to create a suction in the chamber which suction is applied to bores 35 in the heating face for sucking in molten or liquefied solder.

Figure 2:
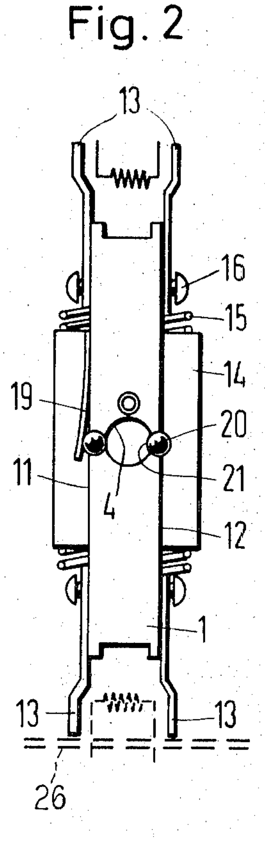
FIG. 2 is an end view of the gripping head of FIG. 1.

As best illustrated in FIGS. 1 and 2, the gripping means or head comprises a housing 1 having a parallelepiped shape with narrow surfaces 2 and 3 which are interconnected by the longer or wider surfaces 11 and 12. As illustrated, one end of the housing 1 is wider than the other end. The housing 1 has a bore or opening 4 which rotatably receives the shaft or bolt 5 to provide the rotatably mount of the housing on the end 6 of the leg 7.

A first pair of gripping elements 9 are attached or mounted on the narrow sufaces 2 and 3 with their free ends extending passed the end of the housing. In a similar manner, a second pair of gripping elements 9' are mounted adjacent the opposite end of the housing. Each of the gripping elements 9 and 9' are formed from a leaf spring whose free end has been bent to provide a flange 10 thereon. When the elements 9 or 9' are mounted on the housing 1, the flanges 10 form hook portions for engaging or gripping the component such as 30. As illustrated, the first pair of gripping elements 9 have a greater distance therebetween than the second pair of gripping elements 9′ and thus can handle a component which has larger dimensions.

Associated with each pair of gripping elements 9 or 9′ is at least one member 13. Preferably, a pair of members 13 are associated with each pair of gripping elements and these members are mounted on the wider surfaces 11 and 12. Each of the members 13 is mounted on the housing by a pin 16 received in elongated slots 17 and is thus movable from a first position extending passed the ends of the hook portions 10 to a retracted position adjacent thereto. To urge the members 13 to the first extended position, a biasing means such as a spring 15 is provided. As illustrated, the members 13 of the first and the second pair of gripping elements are aligned so that a single compression spring 15 which is disposed therebetween acts to urge both elements to the first position. To maintain the spring 15 in the desired relationship with regard to the members 13, each of the springs 15 are positioned in a spring passageway or tunnel 14 which is formed by spring retaining plates attached to the surfaces 11 and 12 of the housing.

To maintain the housing in the desired position on the shaft 5, the shaft is provided with at least one groove 21 which receives a detent such as a spherical body or ball 20 carried by the housing. The ball 20 is biased into the groove 21 to hold the housing in the selected rotational postion on the shaft 5. At least one of the spring retaining plates is provided with a slot or groove 18 to form a lug 19 that engages the ball or spherical body and urges it into the groove 21.

When a component such as 30 is secured on a circuit board or carrier board 26 (shown in broken lines), the connecting elements 31 of the component extend through openings provided in the circuit board 26 and are soldered by solder joints at points 25 to appropriate metal strips such as conductive strips of the circuit board.

To use the tool 8, the housing 1 attached to the leg 7 is placed on the side of the circuit board on which the component 30 is mounted with portions 10 of the gripping elements 9 engaging the component in a hook fashion such as illustrated in bold lines for the pair of connecting elements 9′. When the component attached on the board 26 is engaged by the elements 9 in offset portions the members 13, which may be provided with offsetportions and have a rounded end surface, engage the surface of the board and are urged towards the second position against the force of the spring 15. The heating head 23 disposed on the arm 22 is positioned on the opposite side of the board from the housing 1 with the bores 35 receiving the solder joints 25, connecting elements 31 so that heat can be applied to the solder joints 25. The suction device 25 is cocked and heat is applied to the heating head 23 by closing a switch provided in the electrical supply cable. As the solder is heated to the melting point, the force of compression spring 15 urges the member 12 to the first position, such as illustrated in FIG. 1, and thus moves the housing 1 and the associated gripping elements 9 away from the surface of the board 26 to pull the component from the board and remove the connecting elements from the openings of the board. By selecting the spring characteristics for the spring 15, the correct force can be applied between the housing 1 and board 26 to withdraw the component as the solder beings to melt.

As mentioned above, the members 13 may be coupled through either an electrical or a mechanical coupler to the suction device or means 24 so that as the spring 15 urges the housing 1 away from the surface of the board at the moment the solder joints 25 become molten or liquefied, the piston is triggered to create a suction to withdraw or remove any molten solder. Thus, the member 13 in conjunction with the spring 15 besides withdrawing the component and its connecting elements 31 from the circuit board at the instance the solder becomes molten can be utilized to trigger the suction device at the appropriate time for sucking up any molten solder produced by the heating head 23. The coupling arrangement while not illustrated can comprise a linkage between a member 13 and a pawl which holds the piston in the cocked position. Thus, movmeent of the member 13 towards the first position such as illustrated in the figures, withdraws the pawl to release the spring loaded piston.

As mentioned above, the pair of gripping elements 9 have a different dimension than the pair of gripping elements 9′ so that the tool or device can be utilized to handle components having different dimensions. Thus, the housing 1 can be rotated to present the desired size of gripping elements for the particular component being removed from a circuit board such as 26.

Although various minor modifications might be suggested by those versed in the art, it should be understood that I wish to employ within the scope of the patent warranted herein all such modifications as reasonably and properly come within the scope of my contribution to the art.

I claim:

1. In a device for removing a component of small dimensions from a carrier plate, the component being connected to the carrier plate by connecting elements which project through openings in the carrier plate and are attached to conductors thereon by solder joints, said device comprising a tong-like tool having a pair of legs interconnected at a pivot point, means for gripping a component disposed on an end of one of said pair of legs and a heating head being disposed on an end of the other of the pair of legs and having bores in a face for receiving the solder joints applying heat to the solder joints of the component, the improvement comprising the means for gripping including a housing, at least one pair of gripping elements mounted on opposite surfaces of the housing adjacent one end surface thereof with a free end of each element extending passed the end surface for engaging the component to be removed from the carrier plate, at least one member mounted on said housing with the end of each member being movable between a first position extending passed the free ends of the gripping elements to a second position adjacent the free ends, and means biasing said member to said first position so that when the pair of gripping elements engages a component and the solder joints connecting the connecting elements of the component to the carrier plate are liquefied by the heating head and said member engages the surface of the carrier plate, said biasing means acting on said member urges the housing away from the carrier plate to withdraw the connecting elements of the components from the openings in the carrier plate.

2. In a device according to claim 1, wherein each of the gripping elements is a leaf spring having a flange at said free end to provide a pair of inwardly directed hook portions for engaging the component.

3. In a device according to claim 1, wherein said housing is a parallelepiped and wherein said gripping means includes a pair of said members, each of said members being mounted on opposite sides of the housing between the gripping elements, each member being mounted on the housing by a pin received in an elongated slot provided in the member.

4. In a device according to claim 1, wherein said heating head includes means for applying a suction to the bores for removing molten solder, and said device includes means coupling the member to the suction means for actuating the suction means as the member moves to the first position.

5. In a device according to claim 1, wherein said housing is rotatably mounted on a shaft connected to the one leg of the device, said housing including at least a second pair of gripping elements mounted at an end opposite said one pair of gripping elements with the distance between the second pair of gripping elements being different than the distance between said one pair, at least one member associated with said second pair and being mounted for movement at the opposite end of the housing between a first position extending passed the free ends of the second pair of gripping elements to a position adjacent the free ends, and means biasing said member to said first position so that rotation of the housing enables positioning different pairs of gripping elements for use in removing components of different dimensions.

6. In a device according to claim 5, wherein the housing includes means for holding it in selected rotational positions on the shaft.

7. In a device according to claim 6, wherein the member associated with said one pair of gripping elements and the member associated with said second pair are aligned and wherein the means for biasing comprises a compression spring received in a passageway in the housing extending there between, said passageway being provided by a spring plate mounted on a side of the housing.

8. In a device according to claim 7, wherein the means for holding comprises at least one groove provided on said shaft, a spherical body carried in said housing for cooperating with said groove, and means for biasing the spherical body into said groove.

9. In a device according to claim 8, wherein the means for biasing the spherical body comprises a spring lug formed on the spring retainer plate.

10. In a device according to claim 9, wherein said heating head includes means for applying a suction to the bores 1 for removing molten solder, and said device includes means coupling the members to the suction means for actuating the suction means as the member is moved to the first position.

* * * * *